United States Patent
Oshio

(10) Patent No.: US 7,336,016 B2
(45) Date of Patent: Feb. 26, 2008

(54) SURFACE-ACOUSTIC WAVE DEVICE AND METHOD OF MANUFACTURING SAME

(75) Inventor: Masahiro Oshio, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 429 days.

(21) Appl. No.: 10/911,625

(22) Filed: Aug. 5, 2004

(65) Prior Publication Data

US 2005/0062560 A1 Mar. 24, 2005

(30) Foreign Application Priority Data

Aug. 20, 2003 (JP) .............................. 2003-296030

(51) Int. Cl.
*H03H 9/64* (2006.01)
*H01L 41/04* (2006.01)

(52) U.S. Cl. .............................. 310/313 B; 310/313 R; 333/195

(58) Field of Classification Search ........ 310/313 ALL
See application file for complete search history.

(56) References Cited

U.S. PATENT DOCUMENTS

| 5,953,433 | A | * | 9/1999 | Fujimoto et al. | ............ 310/360 |
| 5,998,907 | A | * | 12/1999 | Taguchi et al. | ......... 310/313 R |
| 2002/0171512 | A1 | * | 11/2002 | Kadota et al. | .......... 310/313 D |
| 2007/0096592 | A1 | * | 5/2007 | Kadota et al. | .......... 310/313 A |

FOREIGN PATENT DOCUMENTS

JP   A 61-73409   4/1986
JP   A 10-224172  8/1998
JP   A 2002-76835 3/2002

OTHER PUBLICATIONS

Nakamura et al., "Shear-Horizontal Surface Acoustic Wafe (SH-SAW) and its Application to SAW Devices," (online)(searched on Aug. 18, 2003) internet >http://www.ecei.tohoku.ac.jp/~nakamura/shsaw.html>, Aug. 18, 2003.
Avramov., "High Performance GHz Range Surface Transverse Wave Resonator Devices. Applications to Low-Noise Microwave Oscillators and Communication Systems," pp. 132-137, International Meeting on Future Trends of Acoustic Wave Devices, Tokyo, 1996.

* cited by examiner

*Primary Examiner*—J. San Martin
(74) *Attorney, Agent, or Firm*—Oliff & Berridge, PLC

(57) ABSTRACT

A new surface acoustic wave device in which higher frequency can be achieved and that shows enhanced temperature characteristics, is provided in a surface acoustic wave device utilizing an SH type high speed surface wave, when an IDT electrode is formed on a quartz substrate whose Euler angle is represented as (0°, θ [θ is from 125 to 142]°, 90°), temperature coefficient of frequency of the quartz substrate at given temperature is made be minus by controlling the film thickness of the IDT electrode, and thereafter the IDT electrode is covered by a thin film having temperature coefficient of frequency that is plus at the given temperature. According to this, since the temperature coefficient of frequency TCF of the whole device becomes zero and second order temperature coefficient β is enhanced, a surface acoustic wave device in which higher frequency is easily achieved and that has enhanced temperature characteristics can be provided.

6 Claims, 9 Drawing Sheets

SURFACE-ACOUSTIC WAVE DEVICE AND METHOD OF MANUFACTURING SAME

BACKGROUND OF THE INVENTION

1. Field of Invention

The present invention relates to a surface acoustic wave device that can be used for widespread application as a band-path filter in mobile communication devices, such as a cellular phone, and as a resonator of a reference clock, and so on, and a method of manufacturing the same.

2. Description of Related Art

A related art surface acoustic wave device has a structure, as shown in FIG. 9 for example, in which an IDT (Inter Digital Transducer) electrode 20 constituted by combining at least a couple of comb electrodes formed of a conductive film is provided on a piezoelectric elastic substrate (piezoelectric substrate) 10, while ladder reflecting electrodes 30 formed of a conductive film, likewise are provided at both sides of the IDT electrode 20.

When an electrical signal is applied to the IDT electrode 20, which is at the center, conversion from the electrical signal to a surface acoustic wave (hereinafter SAW) and reverse conversion thereof is implemented on a surface of the piezoelectric substrate 10. The reflecting electrodes 30 reflect a surface acoustic wave generated on a surface of the piezoelectric substrate 10 so as to cause resonation. By utilizing this, a resonator, a band-path filter, and so on can be constituted.

Examples of such a surface acoustic wave utilized in a surface acoustic wave device include a Rayleigh wave having major components that are displaced vertical to a surface of the substrate 10 and displaced along a surface wave propagation direction, and a leaky surface acoustic wave (Leaky Wave) which propagates while emitting energy to inside of the substrate. Moreover, the related art includes an SH (transverse wave) type surface acoustic wave.

This SH type surface acoustic wave is in a wave mode in which energy of a displacement component vertical to a surface wave propagation direction and that parallel to a surface of the substrate 10 is confined to a substrate surface by the IDT electrode 20 and so on. The SH type surface acoustic wave is essential to achieve higher frequency of a surface acoustic wave device since acoustic velocity (propagation velocity) thereof is larger than that of a Rayleigh wave and so on.

Specifically, since it has been disclosed in the related art that the center frequency f of the surface acoustic wave device satisfies relationship f=v/λ (here, v is propagation velocity of a surface acoustic wave, and λ is wavelength), in order to achieve higher frequency of the device, wavelength λ is decreased. Specifically the pitch between electrode fingers determining the length of wavelength λ is decreased. However, the decreasing of a pitch is limited because of the limit of a manufacturing device. Thus, utilizing a surface acoustic wave whose propagation velocity v is large enables the aim to be achieved effectively.

As such a SH type surface wave having large propagation velocity, for example, a +90° X-propagating transverse leaky wave of an ST-cut quartz substrate that is a rotated Y-cut plate shown in Japanese Unexamined Patent Publication No. 61-73409, and a BGS wave (Bleustein-Gulyaev-Shimizu wave) described in Kiyoshi Nakamura et al. "Research on a transverse (SH type) surface acoustic wave and application thereof to communication devices" (online) (searched on Aug. 18, 2003) internet <http://www.ecei.tohoku.ac.jp/~nakamura/shsaw.html>, which is a pure transverse surface acoustic wave, and a Love wave, an STW (Surface Transverse Wave: propagation velocity 5100 m/s) described in Implementation Report on Assistance Project for Industry-University Cooperative Research of Japan Society for the Promotion of Science, "High Performance GHz Range Surface Transverse Wave Resonant Devices. Applications to Low Noise Microwave Oscillators and Communication System", 1995, pp. 132-137, which is excited in a quartz substrate, and so on has been disclosed.

In the case of a device utilizing an SH type surface wave, whose propagation velocity is large, higher frequency can be achieved comparatively easily. However, it has a defect, such as low reliability against temperature since variation in frequency with respect to temperature is large compared to a device using an ST-cut Rayleigh wave as shown in FIG. 10.

Thus, a related art method is disclosed in Japanese Unexamined Patent Publication No. 2002-76835. In this method, with using 37°-45° rotated Y-cut quartz substrate in which temperature coefficient of frequency (TCF hereinafter) of an STW is plus, and a thin film whose TCF is minus, the thin film having thickness depending on the cut angle of the quartz substrate is formed on the quartz substrate so as to make TCF zero (cancel out TCF), and thereby enhancing frequency-temperature characteristics. Here, TCF is represented by the following formula and is the slope of frequency with respect to temperature around room temperature in general.

$$TCF = f^{-1}(\delta f/\delta T)(\text{ppm/degrees centigrade})$$

In addition, in Japanese Unexamined Patent Publication No. 10-224172, on a quartz substrate with Euler angle (0°, 123°-177°, 90°) in which temperature coefficient of delay (hereinafter TCD) of an SH type leaky wave has a minus value, a piezoelectric thin film whose TCD is plus is formed, so as to make TCD zero, and thereby enhancing frequency-temperature characteristics. Furthermore, the relationship between Euler angle and the thickness of a thin film (ZnO film) to increase electromechanical coupling coefficient $k^2$ contributing to widening of band of a device is illustrated. TCD has a relationship TCD=−TCF since the phase velocity of a surface wave and the group velocity thereof are almost equal to each other.

SUMMARY OF THE INVENTION

However, in the related art method in which frequency-temperature characteristics are enhanced by utilizing a thin film whose temperature coefficient of frequency TCF or temperature coefficient of delay TCD is minus or plus, the calculated value of TCF or TCD is greatly different from the actually obtained TCF or TCD since the calculated value is a value calculated on the premise of an ideal state where the effect of film thickness of an electrode, such as an IDT electrode formed on a substrate, is ignored.

Specifically, the energy of an surface acoustic wave is susceptible to the effect of electrode film thickness since the energy concentrates in a surface of a substrate, such that the temperature characteristics of the substrate is different from that after forming an electrode. Thus TCF or TCD is not specified only with a Euler angle of the substrate. It therefore turns to be inappropriate to select a thin film to correct temperature coefficient based on only a Euler angle of a substrate as with a related art method.

Furthermore, in either related art example, attention is focused only on TCF and TCD, which show a slope with respect to temperature around room temperature, and second order temperature coefficient β, which greatly affects the amount of frequency variation within a desired temperature range, is not taken into consideration at all.

Accordingly, the present invention addresses such a problem effectively and provides a new surface acoustic wave device in which higher frequency is easily achieved and that can show excellent temperature characteristics, and a method of manufacturing the same.

First Aspect

In order to address the above problem, a surface acoustic wave device of a first aspect includes: a quartz substrate with Euler angle (0°, θ [θ is from 125 to 142]°, 90°) exciting an SH type surface wave; an interdigital transducer (IDT) electrode having given film thickness and provided on the quartz substrate in order to make a temperature coefficient of frequency (TCF) of the quartz substrate at the given temperature be minus; and a thin film whose TCF is plus at the given temperature, and that covers the IDT electrode.

According to an aspect of the present invention, first, an SH type high speed surface acoustic wave, such as an STW, can be excited by using a quartz substrate whose Euler angle is represented as (0°, θ [θ is from 125 to 142]°, 90°) such that higher frequency can easily be achieved.

Furthermore, the temperature coefficient of frequency TCF of the quartz substrate at the given temperature is controlled to be minus with the IDT electrode having given film thickness, while the IDT electrode is covered by the thin film having a temperature coefficient of frequency TCF that is plus at the given temperature. Thus, since temperature coefficient of frequency TCF is controlled to be zero at the given temperature, specifically the center of use environment temperature range, as described in detail in the below exemplary embodiment, frequency variation in the temperature range can be minimized.

In addition, since second order temperature coefficient β is approximated to zero, as described in detail in the below exemplary embodiment, the amount of frequency variation with respect to temperature in use environmental temperature range is further reduced such that stable operation is possible.

Specifically, the present invention is devised by having discovered that, with respect to a quartz substrate with such Euler angle that an SH type high speed surface acoustic wave can be excited, even in the case of Euler angle in which temperature coefficient of frequency TCF has been thought as plus, a phenomenon where TCF is reversed to be minus is generated depending on the relationship between electrode film thickness and θ, and by having discovered the specific boundary line for this phenomenon. With a structure adapted to such a phenomenon, higher frequency and enhancement of temperature characteristics can be achieved.

Furthermore, this thin film offers not only an effect of enhancing frequency-temperature characteristics of a substrate side, but also an advantageous effect of protecting an electrode, enhancing yield by avoiding short-circuit, and so on, simultaneously.

Second Aspect

In a surface acoustic wave device of a second aspect, the thin film is composed of a material whose base substance is any of silicon oxide ($SiO_2$), silicon nitride ($Si_3N_4$), and titanium nitride (TiN) with respect to the surface acoustic wave device of the first aspect.

Specifically, these materials show a plus temperature coefficient of frequency TCF when a thin film thereof is formed. Accordingly, a first order temperature coefficient can easily be corrected by utilizing these materials as a thin film and appropriately adjusting the film thickness thereof.

Third Aspect

In a surface acoustic wave device of a third aspect, with respect to the surface acoustic wave device of the first or second aspect, the IDT electrode is composed of a material whose base substance is Al, and θ of the Euler angle and normalized film thickness (H/λ [H=actual film thickness, λ=wavelength]) of the IDT electrode has a relationship expressed with the following formula.

$$H/\lambda > -4.418215 \times 10^{-6} \times \theta^4 + 2.407644 \times 10^{-3} \times \theta^3 - 4.919222 \times 10^{-1} \times \theta^2 + 4.466510 \times 10 \times 10 \times \theta - 1.520615 \times 10^3$$

Specifically, in an aspect of the present invention, the range in which temperature coefficient of frequency TCF can be minus by adjusting electrode film thickness when using a quartz substrate with such a Euler angle that an SH type high speed surface acoustic wave can be excited, is concretely specified using the formula. According to this, higher frequency and enhancement of temperature characteristics can be achieved as with the first aspect.

Fourth Aspect

In a surface acoustic wave device of a fourth aspect, the normalized film thickness (H/λ) of the IDT electrode is equal to or less than 0.1 with respect to the surface acoustic wave device of the third aspect.

Fifth Aspect

A method of manufacturing a surface acoustic wave device of a fifth aspect includes: forming an interdigital transducer (IDT) electrode on a quartz substrate whose Euler angle is represented as (0°, θ [θ is from 125 to 142]°, 90°) with controlling film thickness of the IDT electrode so as to make temperature coefficient of frequency (TCF) of the quartz substrate at given temperature be minus; and covering the IDT electrode with a thin film having TCF that is plus at the given temperature.

Thus, a surface acoustic wave device that can excite an SH type high speed wave, such as an STW and can show excellent temperature characteristics in a wide temperature range can be obtained.

Sixth Aspect

In a method of manufacturing a surface acoustic wave device of a sixth aspect, the thin film is composed of a material whose base substance is any of silicon oxide ($SiO_2$), silicon nitride ($Si_3N_4$), and titanium nitride (TiN) with respect to the method of manufacturing a surface acoustic wave device of the fifth aspect.

According to this, since temperature coefficient of frequency TCF of a substrate can easily be corrected as with second aspect, a surface acoustic wave device that can excite an SH type high speed surface acoustic wave, and can show excellent temperature characteristics in a wide temperature range can easily be obtained.

Seventh Aspect

A band-pass filter of a seventh aspect includes the surface acoustic wave device of any of first through fourth aspects.

Thus, a band-pass filter of high performance and high reliability is obtained since higher frequency and enhancement of temperature characteristics are achieved.

Eighth Aspect

A surface acoustic wave resonator of an eighth aspect includes the surface acoustic wave device of any of first through fourth aspects.

Thus, an SAW resonator of high performance and high reliability is obtained since higher frequency and enhancement of temperature characteristics are achieved.

According to the present invention, since a temperature coefficient of frequency TCF can easily and surely be controlled to be zero, the amount of frequency variation can be minimized with controlling the turnover temperature to be the center of use environment temperature range, while second order temperature coefficient β can also be approximated to zero. Thus the amount of frequency variation can further be reduced.

In addition, protection for electrode and countermeasures against short-circuit are accomplished simultaneously by utilizing a thin film, such as $SiO_2$ having excellent insulation characteristic, such that manufacturing yield is also enhanced.

DETAILED DESCRIPTION OF EXEMPLARY EMBODIMENTS

Best mode for carrying out the present invention will be described below with reference to accompanying drawings.

Figure 1:
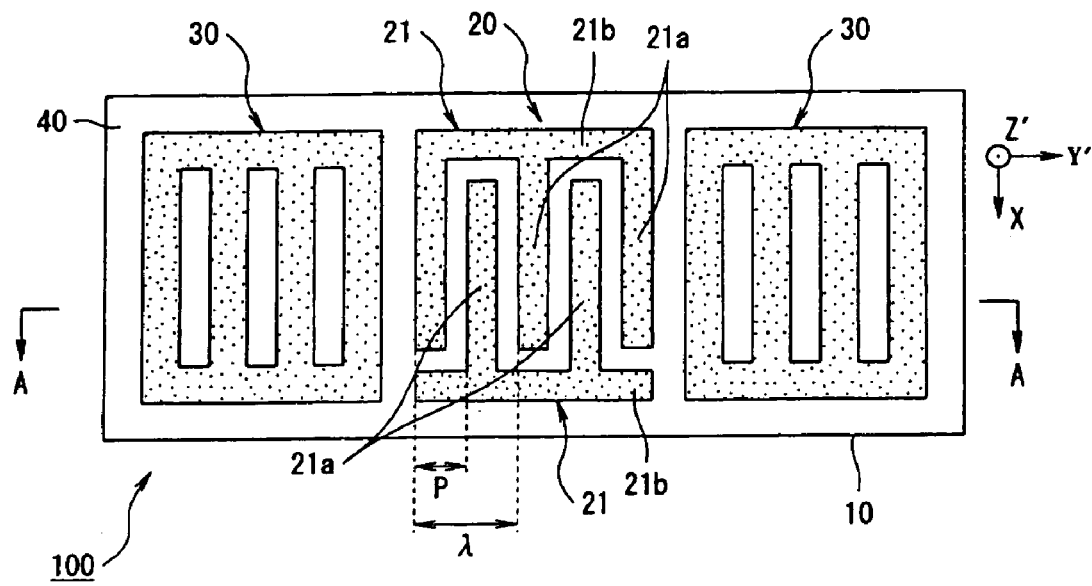
FIG. 1 is a schematic showing one exemplary embodiment of a surface acoustic wave device according to the present invention.
Figure 2:
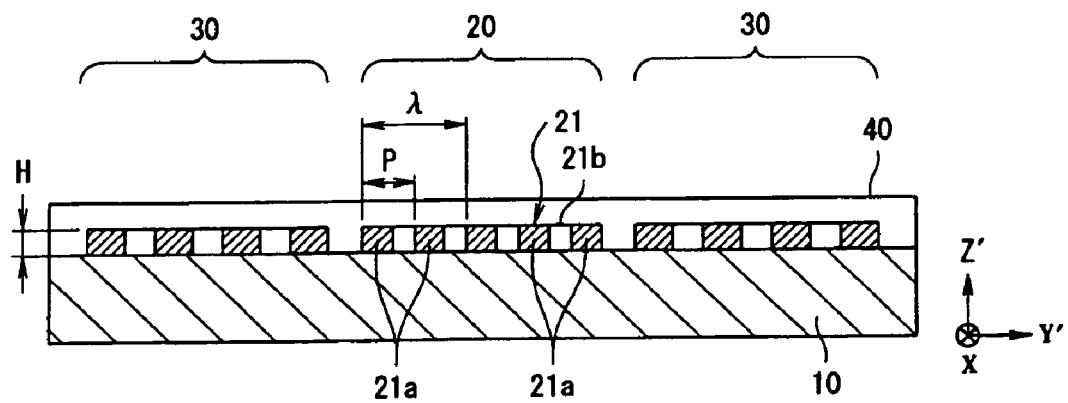
FIG. 2 is a schematic along plane A-A of FIG. 1.

FIG. 1 is a schematic showing one exemplary embodiment of a surface acoustic wave device 100 according to the present invention, and FIG. 2 is a sectional view along plane A-A of FIG. 1.

As shown in the drawing, the surface acoustic wave device 100 has a structure in which the IDT electrode 20 formed of a conductive thin film, such as Al, is provided on the center part of a top surface of a rectangular piezoelectric substrate 10 formed of a quartz substrate while the reflecting electrodes 30 of a ladder-shape formed of a conductive thin film, such as Al likewise are provided at both sides of the IDT electrode 20. In addition, the whole of the IDT electrode 20 and the reflecting electrodes 30 are covered by a thin film 40.

The IDT electrode 20 is formed by disposing at least a couple of comb electrode members 21 so that the electrode members 21 are combined to each other (interdigitated). When AC voltage is applied to the IDT electrode 20, distortions in phase opposition are generated periodically on a surface of the substrate 10 between electrode fingers 21a adjacent to each other because of piezoelectric effect and thereby a surface wave having wavelength λ is excited.

Each of the electrode members 21 has a comb shape in which ends of the plurality of electrode fingers 21a extending parallel to each other are connected to each other with a bus bar 21b. The wavelength λ in the present exemplary embodiment corresponds to double the pitch P between the electrode fingers 21a adjacent to each other (λ=2P), as shown in the drawing. The film thickness H of the electrode means the height of the IDT electrode 20 and the reflecting electrodes 30 in a thickness direction.

Figure 3:
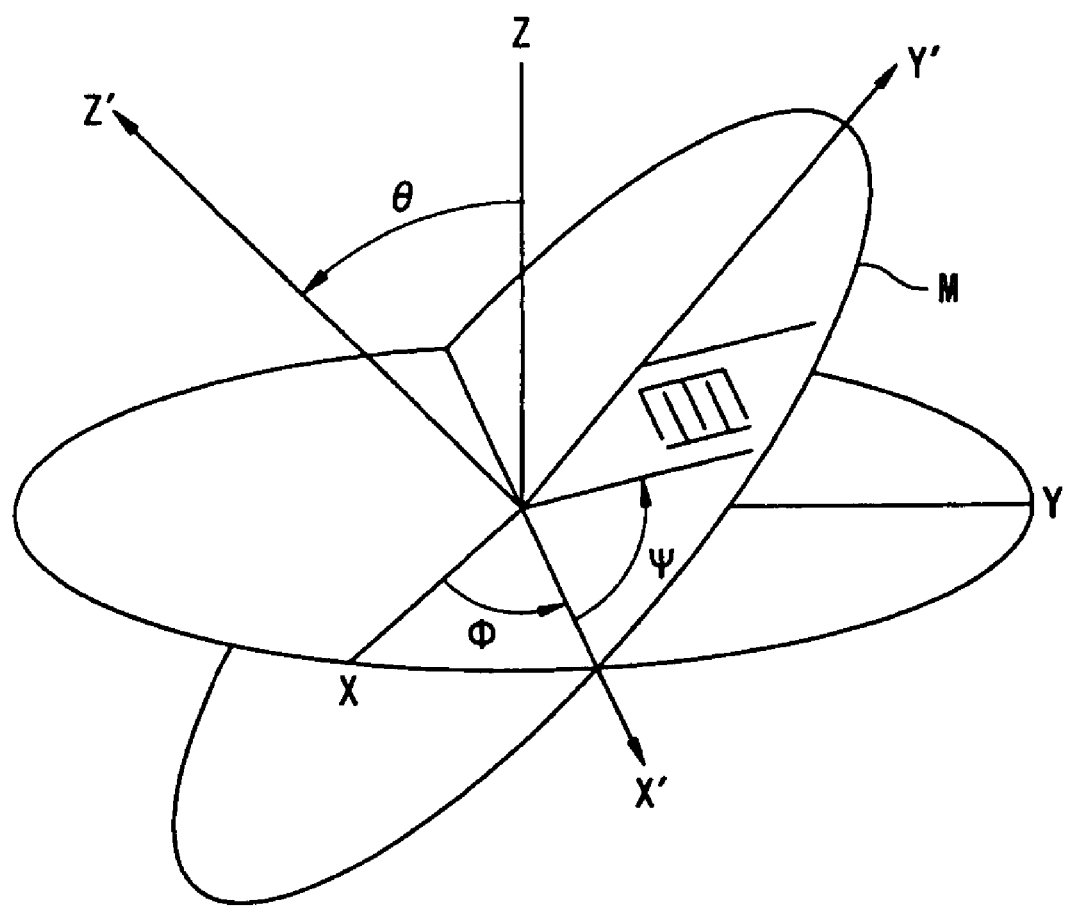
FIG. 3 is a schematic showing the cutting orientation of a quartz substrate of a surface acoustic wave device.

With respect to a quartz substrate constituting the piezoelectric substrate 10 of a rectangular shape, the cutting angle of the surface and the propagation direction are within the range of Euler angle (0°, 125°-142°, 90°) shown in FIG. 3, in order to excite an STW. The IDT electrode 20 is composed of Al and the film thickness H thereof is set so that temperature coefficient of frequency TCF is minus within a hatched area R of FIG. 5 surrounded by lines L1, L2, and L3. FIG. 3 is a schematic showing a cutting orientation of the quartz substrate. In the case where a cut surface M is represented with a first rotational angle Φ, by which rotation is made around Z axis with defining an anticlockwise direction as positive, and a second rotational angle θ, by which rotation is made around X axis after the rotation by Φ with defining an anticlockwise direction as positive, and a surface propagation direction in a substrate surface is defined using a third rotational angle Ψ, by which rotation is made around Z axis after the rotation by θ with defining an anticlockwise direction as positive, the orientations are represented as (Φ, θ, Ψ) in terms of Euler angle representation.

Figure 4:
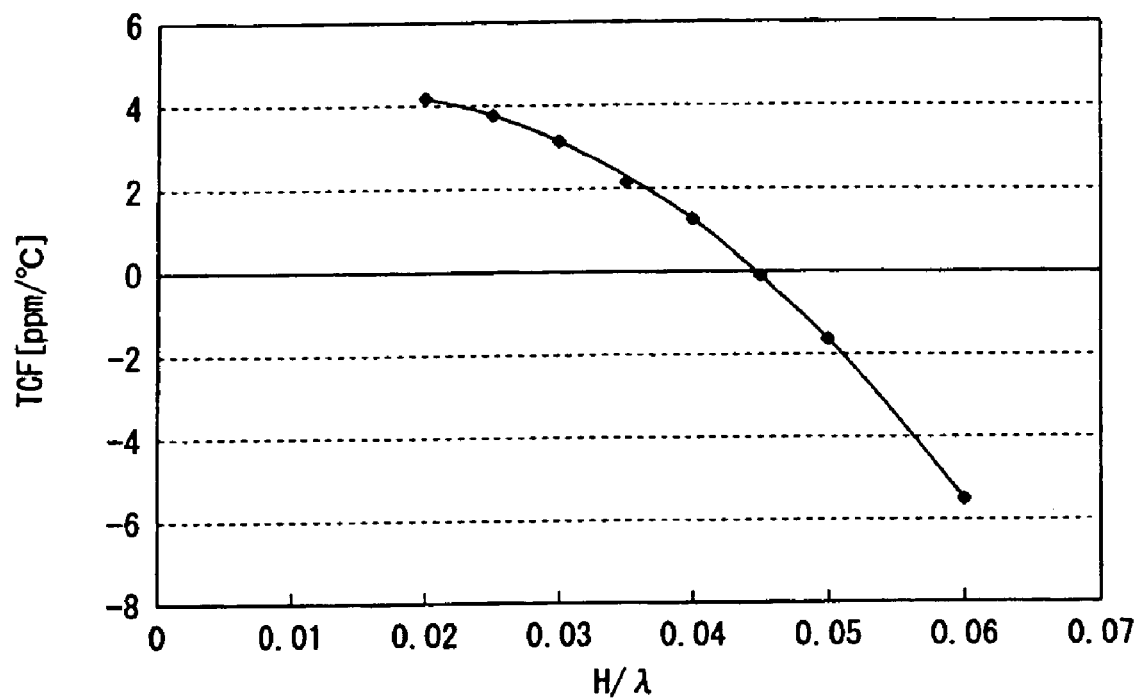
FIG. 4 is a graph showing variation in first order temperature characteristics with respect to the electrode film thickness of a quartz substrate.

FIG. 4 shows the relationship between normalized electrode film thickness H/λ and temperature coefficient of frequency TCF at reference temperature of 25 degrees centigrade in the case of using a quartz substrate with Euler angle (0°, 127°, 90°). TCF crosses zero when H/λ is in the vicinity of 0.045 (4.5%), specifically turnover temperature becomes 25 degrees centigrade, which is reference temperature in this case. TCF is minus when H/λ is 0.045 or more, and is plus when 0.045 or less. When reference temperature is varied, the value of TCF with respect to electrode film thickness changes although not shown in the drawing.

Figure 5:
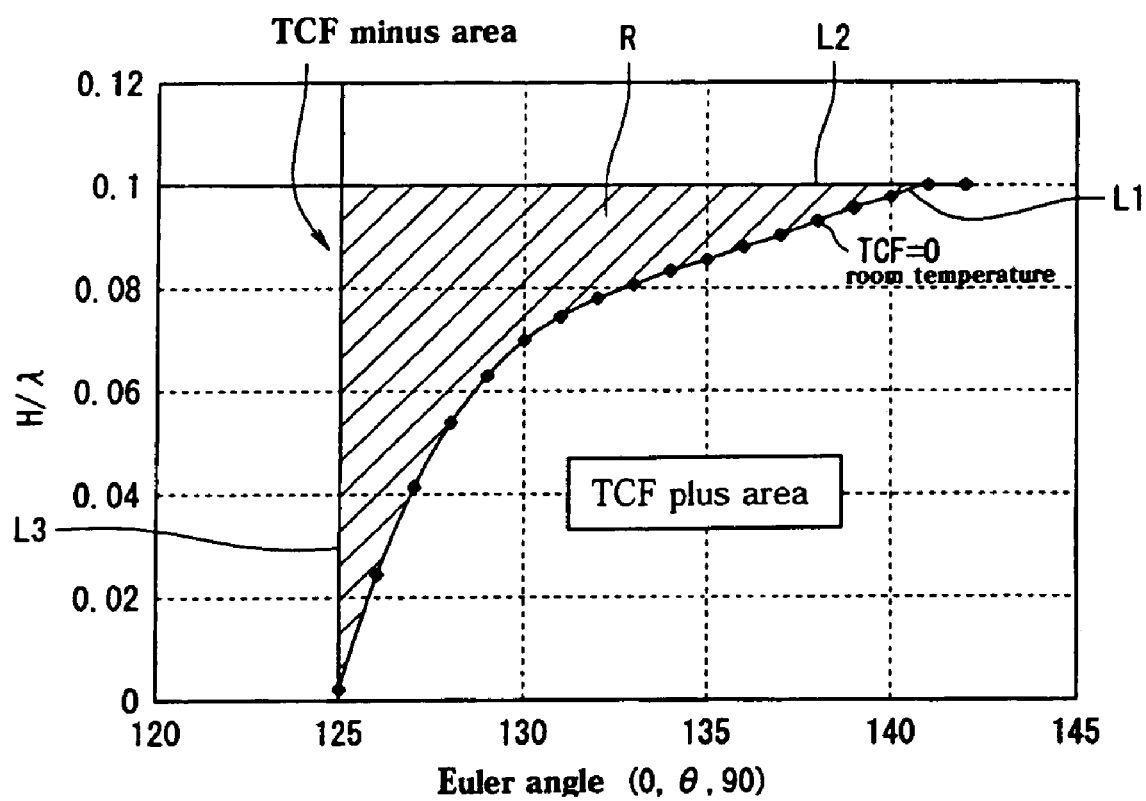
FIG. 5 is a graph showing variation in TCF depending on Euler angle θ and an electrode film thickness H/λ.

FIG. 5 shows the relationship between Euler angle θ and normalized electrode film thickness H/λ. An upward line L1 in the drawing is a boundary line indicating the combinations with which temperature coefficient of frequency TCF at room temperature (25 degrees centigrade) becomes zero. The combinations in the left side from the line L1 indicates an area in which TCF is minus, and the combinations of the right side TCF is plus.

In an aspect of the invention, the relationship between Euler angle θ of the quartz substrate 10 and normalized electrode film thickness H/λ is set so that the combination of θ and H/λ is within the hatched area R surrounded by the lines L1, L2, and L3, among the TCF-minus area.

Here, the line L2 is a line showing the upper limit of electrode film thickness through the current thin film forming technique, 0.10 (10%), due to the limit of thickness of a resist film and distortion of a resist film by heat. The line L3 shows the upper limit of θ below which TCF is minus with only substrate.

Specifically, the related art adopts a structure in which TCF is made be zero by forming a thin film with a minus TCF, such as a ZnO film on a quartz substrate with Euler angle (0°, 123°-177°, 90°) in which TCF is regarded as plus, or forming a thin film with plus TCF, such as an SiO₂ film, on a quartz substrate with Euler angle (0°, θ<126.1°, 90°) in which TCF is regarded as minus. As shown in FIG. 5, however, it turns out that TCF can be minus by controlling electrode film thickness even when angle θ is 125° or more.

Accordingly, when, in the range where Euler angle θ is from 125° to 142° and normalized electrode film thickness H/λ is 0.10 or less, both are set in the hatched area R, TCF, which has been regarded as plus in the related art, is minus. Thus, it turns to be possible to make TCF be zero, specifically make the turnover temperature be around room temperature, by utilizing a thin film with a plus TCF.

Figure 6:
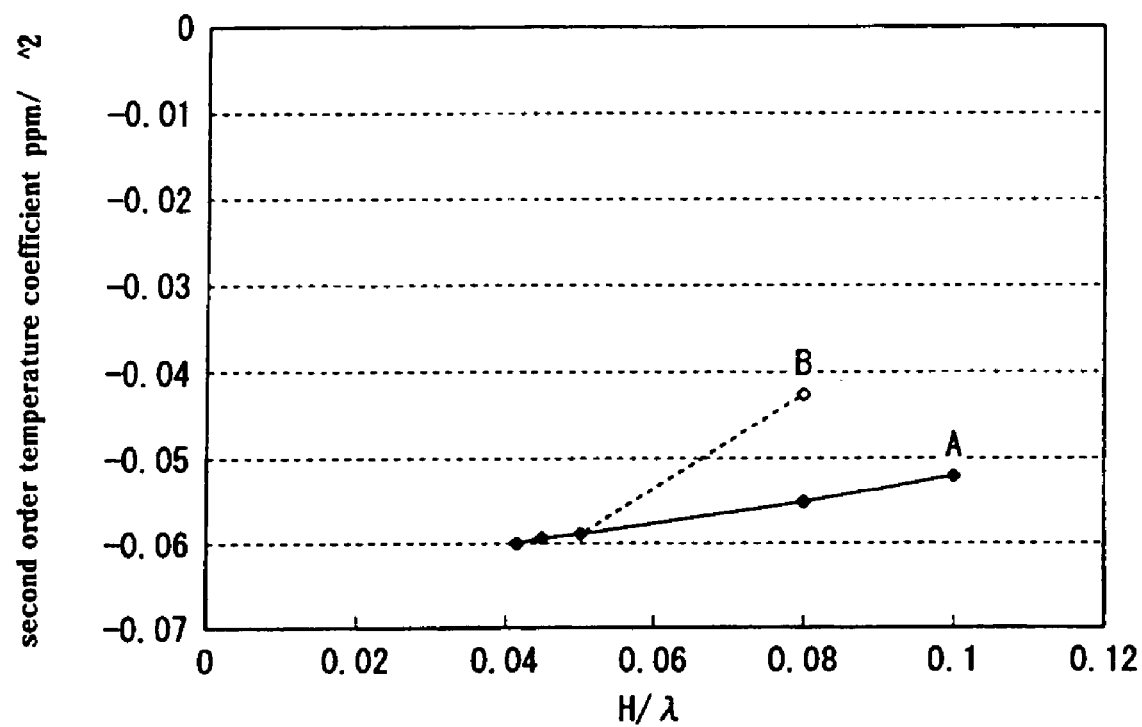
FIG. 6 is a graph showing the relationship between the film thickness of only an electrode and electrode film thickness including a thin film, and second order temperature coefficient.

Next, FIG. 6 shows the relationship between normalized electrode film thickness H/λ on a quartz substrate with Euler angle (0°, 127°, 90°) and normalized film thickness of an SiO₂ film formed thereon, and second order temperature coefficient β. The second order temperature coefficient β is a coefficient corresponding to b when frequency variation ratio with respect to temperature is represented as $(f-f_o)/f_o = a(T-T_o) + b(T-T_o)^2$.

Here, f is frequency, $T_o$ is reference temperature, $f_o$ is frequency at reference temperature $T_o$, and a is temperature coefficient of frequency TCF.

In the drawing, a full line A corresponds to the case where only an electrode is provided to a quartz substrate, and a dashed line B corresponds to the case where normalized electrode film thickness H/λ is set to be 0.05 (5%), and an SiO₂ film is formed thereon. The horizontal axis of the dashed line B indicates value obtained by normalizing the film thickness of an SiO₂ film with λ and adding the resultant value to normalized electrode film thickness H/λ.

As shown with the full line A, displacement distribution of a surface wave is varied because of mass load effect to a substrate surface only by increasing the thickness of the electrode such that second order temperature coefficient β can be enhanced, specifically β can be approximated to zero. However, since the limit of normalized electrode film thickness H/λ is 0.10 because of limitation on manufacturing as described above, effect of enhancing second order temperature coefficient with only electrode is small.

Figure 10:
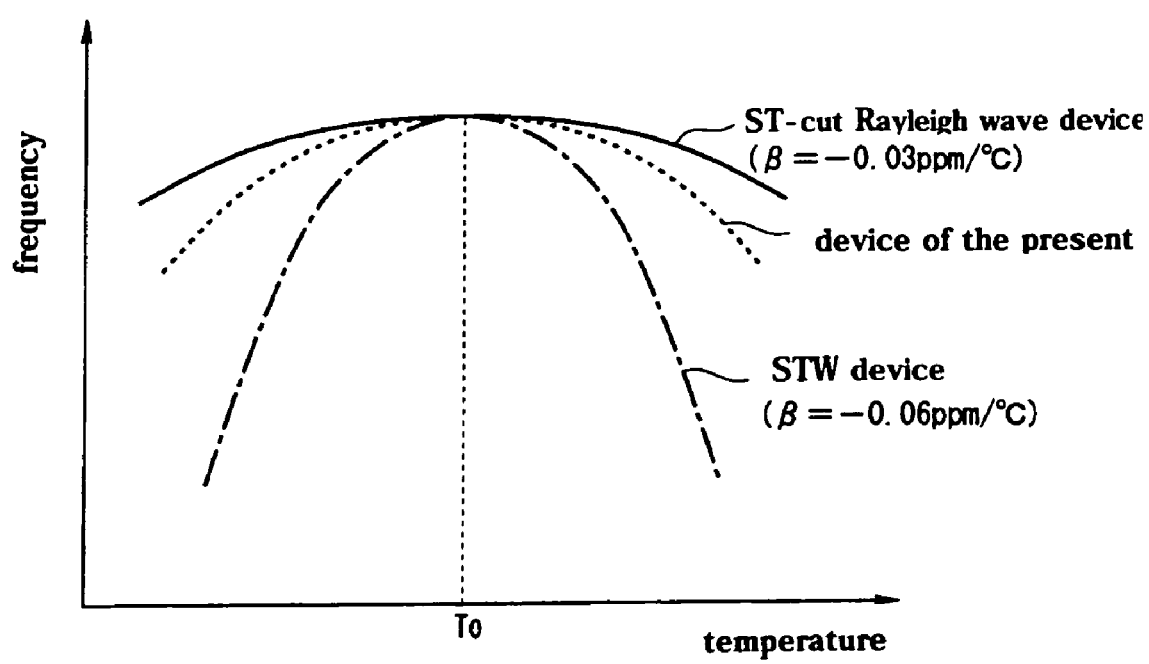
FIG. 10 is a graph showing frequency variation ratio with respect to temperature.

Accordingly, as shown with the dashed line B, when an electrode is formed so that TCF becomes minus and an SiO₂ film with plus TCF is formed on the electrode, TCF is corrected to be zero, specifically turnover temperature is corrected to be around room temperature, while second order temperature coefficient is enhanced because of mass load effect working on the whole substrate surface. Thus, it turns out that a surface acoustic wave device whose frequency variation with respect to temperature is as small as an ST-cut Rayleigh wave device as shown with a dashed line in FIG. 10 can be realized.

Figure 7:
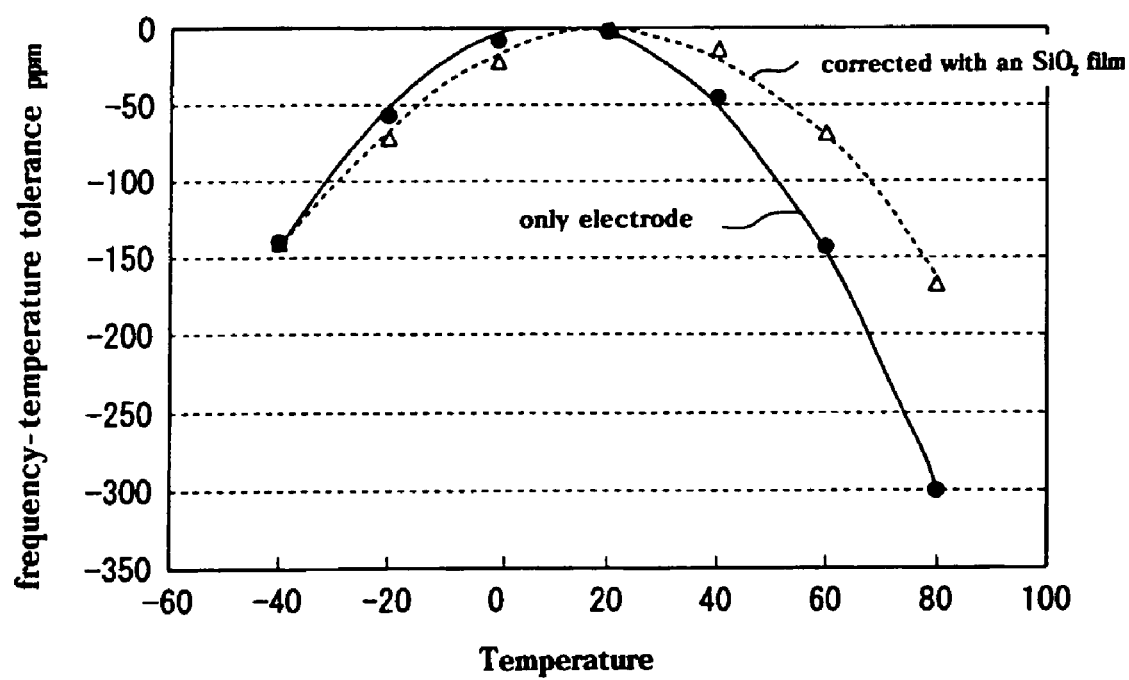
FIG. 7 is a graph showing frequency-temperature characteristics of a quartz substrate including only an electrode, and frequency-temperature characteristics after temperature is corrected with an $Sio_2$ film.

FIG. 7 shows frequency-temperature characteristics (full line) of a quartz substrate including only an electrode, and frequency-temperature characteristics (dashed line) after temperature correction is implemented with an SiO₂ film. As is apparent from the drawing, compared to the case of only a substrate, by providing a thin film, such as an SiO₂ film, not only an effect of moving turnover temperature to around room temperature but also an effect of further enhancing second order temperature coefficient is obtained.

Figure 8:
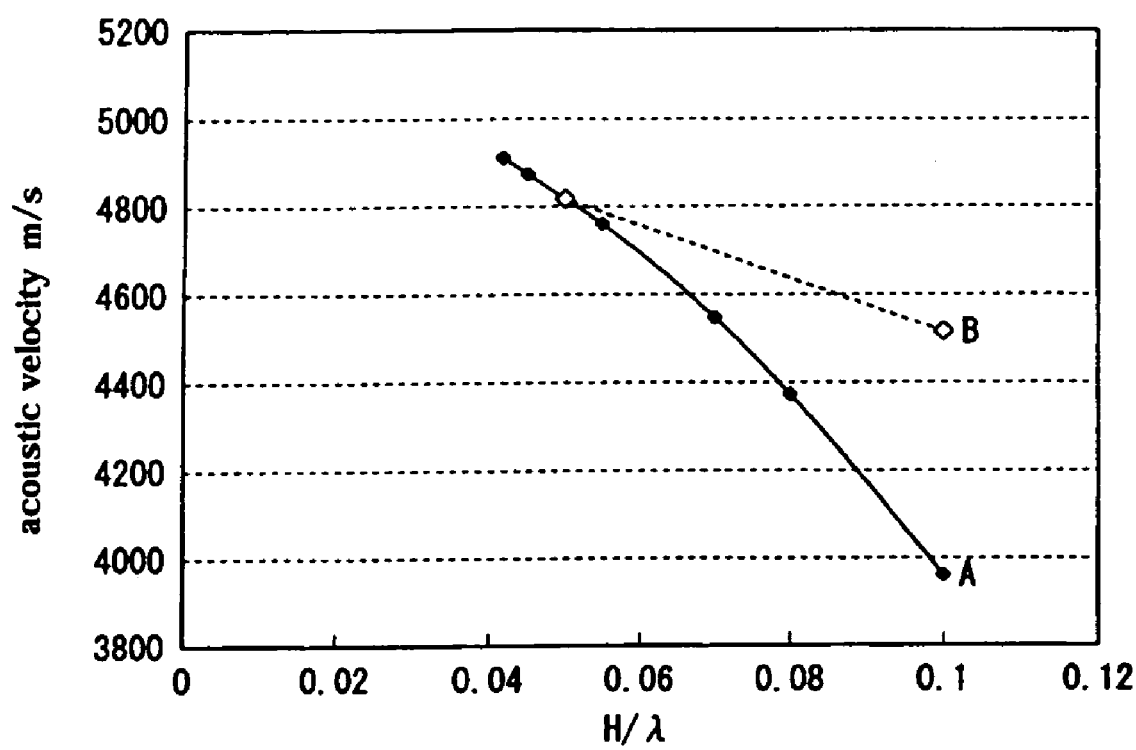
FIG. 8 is a graph showing the relationship between normalized electrode film thickness H/λ on a quartz substrate and normalized film thickness of an $SiO_2$ film formed thereon, and acoustic velocity of a surface wave.
Figure 9:
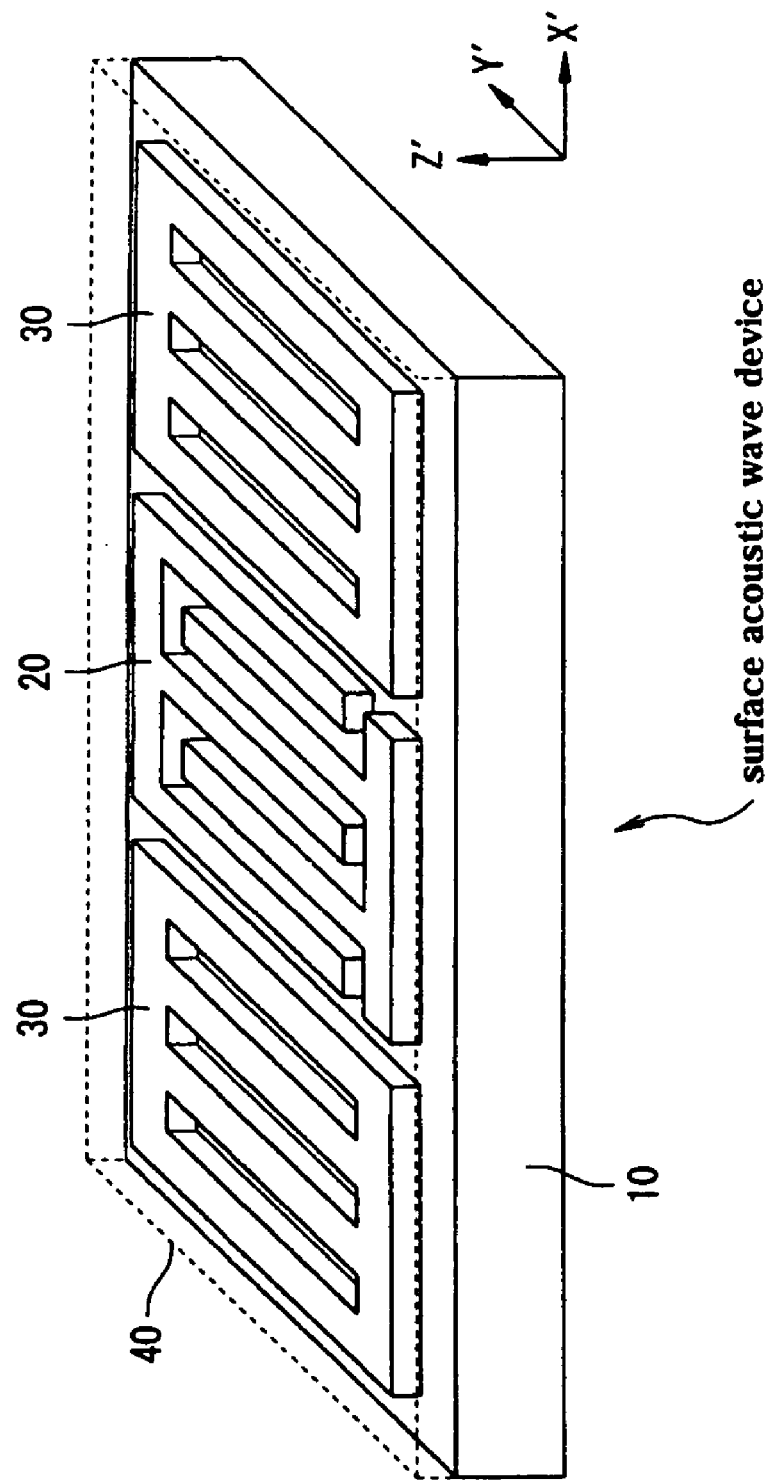
FIG. 9 is a schematic showing an example of a related art surface acoustic wave device.

FIG. 8 shows the relationship between normalized electrode film thickness H/λ on a quartz substrate with Euler angle (0°, 127°, 90°) and normalized film thickness of an SiO₂ film formed thereon, and acoustic velocity of a surface wave.

In the drawing, a full line A corresponds to the case where only an electrode is provided to a quartz substrate, and a dashed line B corresponds to the case where normalized electrode film thickness H/λ is set to be 0.05, and an SiO₂ film is formed thereon. The horizontal axis of the dashed line B indicates value obtained by normalizing the film thickness of an SiO₂ film with λ and adding the resultant value to normalized electrode film thickness H/λ.

As is apparent from the drawing, a drop amount of acoustic velocity with respect to the film thickness of an SiO₂ film is smaller than that of acoustic velocity with respect to the film thickness of an electrode such that decrease in acoustic velocity is suppressed even if temperature characteristics is corrected with an SiO₂ film, and achieving higher frequency of a surface acoustic wave device is not inhibited.

What is claimed is:

1. A surface acoustic wave device, comprising:
    a quartz substrate with a Euler angle (0°, θ[θ is from 125 to 142]°, 90°) exciting an SH type surface wave;
    an interdigital transducer (IDT) electrode having a given film thickness and disposed on a top surface of the quartz substrate, the quartz substrate having a negative temperature coefficient of frequency (TCF) at a given temperature and the given film thickness of the IDT electrode; and
    a thin film covering the IDT electrode, the thin film having a positive TCF at the given temperature and the IDT electrode being disposed between the quartz substrate and the thin film.

2. The surface acoustic wave device according to claim 1, the thin film being composed of a material having a base substance that is any of silicon oxide (SiO₂), silicon nitride (Si₃N₄), and titanium nitride (TiN).

3. The surface acoustic wave device according to claim 1,:
    the IDT electrode being composed of a material having a base substance that is Al; and
    θ of the Euler angle and normalized film thickness (H/λ [H=actual film thickness, λ=wavelength]) of the IDT electrode having a relationship expressed with the following formula:

$H/\lambda > -4.418215 \times 10^{-6} \theta^4 + 2.407644 \times 10^{-3} \times \theta^3 - 4.919222 \times 10^{-1} \times \theta^2 + 4.466510 \times 10 \times \theta - 1.520615 \times 10^3$.

4. The surface acoustic wave device according to claim 3, the normalized film thickness (H/λ) of the IDT electrode being equal to or less than 0.1.

5. A band-pass filter, comprising: the surface acoustic wave device according to claim 1.

6. A surface acoustic wave resonator, comprising:
    the surface acoustic wave device according to claim 1.

* * * * *